United States Patent
Li et al.

(10) Patent No.: US 9,657,123 B2
(45) Date of Patent: May 23, 2017

(54) PHOTORESIST COMPOSITIONS AND METHOD OF PREPARING THE SAME

(71) Applicant: Shenzhen China Star Optoelectronics Technology Co., Ltd., Shenzhen, Guangdong (CN)

(72) Inventors: Ji Li, Guangdong (CN); Yungjui Lee, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 227 days.

(21) Appl. No.: 14/428,357

(22) PCT Filed: Feb. 9, 2015

(86) PCT No.: PCT/CN2015/072544
§ 371 (c)(1),
(2) Date: Mar. 14, 2015

(87) PCT Pub. No.: WO2016/070523
PCT Pub. Date: May 12, 2016

(65) Prior Publication Data
US 2016/0122456 A1 May 5, 2016

(30) Foreign Application Priority Data
Nov. 4, 2014 (CN) .......................... 2014 1 0614148

(51) Int. Cl.
*G03F 7/028* (2006.01)
*G02B 5/20* (2006.01)
*C08F 222/10* (2006.01)
*G03F 7/039* (2006.01)
*G03F 7/00* (2006.01)
*G03F 7/033* (2006.01)
*G02B 5/22* (2006.01)

(52) U.S. Cl.
CPC .......... *C08F 222/10* (2013.01); *G03F 7/0007* (2013.01); *G03F 7/028* (2013.01); *G03F 7/033* (2013.01); *G03F 7/039* (2013.01); *G02B 5/223* (2013.01)

(58) Field of Classification Search
CPC ......... G03F 7/028; G03F 7/033; G02B 5/223; G02F 1/133514; G02F 1/133516
USPC ....................... 430/7, 270.1, 281.1; 349/106
See application file for complete search history.

(56) References Cited

U.S. PATENT DOCUMENTS

| 6,509,125 B1 * | 1/2003 | Ito .......................... G02B 5/201 349/106 |
| 2007/0117031 A1 * | 5/2007 | Mizukawa ............ C08F 220/28 430/7 |
| 2010/0110242 A1 * | 5/2010 | Motallebi ............. C07C 225/34 348/273 |
| 2016/0041466 A1 * | 2/2016 | Deng .................... G03F 7/0388 430/18 |

FOREIGN PATENT DOCUMENTS

CN 104212201 A * 12/2014

* cited by examiner

*Primary Examiner* — John A McPherson
(74) *Attorney, Agent, or Firm* — Andrew C. Cheng

(57) ABSTRACT

The present invention provides a photoresist composition and a method of preparing the same. The photoresist composition includes a color polymer that is obtained by dye molecules grafted to a polymer molecule through chemical bonds. The photoresist composition utilizes the color polymer to replace conventional pigments to preclude conventional problems of difficult to disperse pigments in the photoresist composition, poor contrast and brightness. Since the color polymer has brilliant color, high penetration, good thermal and light stabilities, so that the photoresist composition of the present invention has better color developing effect, preferred thermal and light stabilities. The present invention provides a method of preparing a photoresist composition which reduces components in the photoresist composition and simplifies preparation process of the photoresist composition, the photoresist composition obtained thereby has better color developing effect, also has preferred thermal and light stabilities.

3 Claims, No Drawings

PHOTORESIST COMPOSITIONS AND METHOD OF PREPARING THE SAME

FIELD OF THE INVENTION

The present invention relates to fabricating art of liquid crystal displays, more particularly, a photoresist composition for color filters and a method of preparing the same.

BACKGROUND OF THE INVENTION

Color filter (CF) is an important component of Liquid Crystal Display (LCD) and a source for LCD producing color. CF layer is formed with photoresist material after a series of lithography processes. Common CF photoresist material is formed by dispersing polymer, monomers, a photo initiator and pigments in a solvent, wherein the pigments are one material for CF practicing color. When light emitted from a backlight module is incident in CF layer, only bands corresponding to R, G and B of the light penetrate CF layer, the other bands of the light are absorbed by the pigments, and thus CF layer produces RGB color after the light passed.

Presently, such the common color photoresist containing the pigments still has a lot of problems needed to be overcome. 1. In aspect of preparation of the materials, because the pigments for common use are insoluble in organic solvents, the pigments are dispersed in the color photoresist material with a dispersing technique to form particles of diameters in 60~100 nm under action of a dispersant. To the material manufacturers, the dispersing technique and process of the pigments often are the problems difficult to be broken. 2. In aspect of performance of the materials, since the pigments are state of particles dispersed in the material, the pigments inevitably have reflecting and scattering effects on the light, and such effects lead to decline contrast and brightness of LCD. 3. In aspect of fabrication process of the materials, a resolution of the color polymer containing the pigments is subjected to greater restriction and generally difficult to form a shape less than 2 um.

Presently, every major color photoresist manufacturer actively develops color dye materials. The dyes have a more brilliant color, the dye molecules are completely dissolved in solvent, and thus the dyes have a higher penetration than the pigments. If the dyes are used to replace the pigments, the difficulty of dispersing technique and the problem of poor brightness of the pigments can be overcome. However, the dye molecules have poor thermal and light stabilities that restrict the dye for use in color photoresist.

SUMMARY OF THE INVENTION

One aspect of the present invention is to provide a photoresist composition, which utilizes a color polymer to replace the conventional pigments so as to obviate the difficulty to disperse the pigments in conventional photoresist compositions and the problem of poor brightness thereof. Since the color polymer has brilliant color, high penetration, good thermal and light stabilities, so that the photoresist composition of the present invention has better color developing effect, preferred thermal and light stabilities.

Another aspect of the present invention is to provide a method of preparing a photoresist composition, which reduces components in the photoresist composition and simplifies preparation process of the photoresist composition, the photoresist composition obtained thereby has better color developing effect, also has preferred thermal and light stabilities.

For the above aspects, the present invention provides a photoresist composition including a color polymer that is obtained by the dye molecules grafted to a polymer through chemical bonds.

A structural formal of the color polymer is

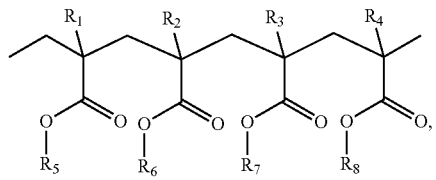

wherein at least one of $R_1$-$R_8$ is a dye group.

The dye group is azo, anthraquinones, xanthene, cyanine, dioxazine or triphenylmethane.

Other substituent groups in $R_1$-$R_8$ besides the dye group are —CN, —H, —COOH, —$C_nH_{2n+1}$, —$OC_nH_{2n+1}$,

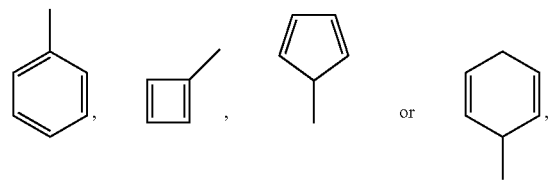

n is an integer in 1-10, the other substituent groups in $R_1$-$R_8$ are identical or different.

A structural formula of the xanthene is

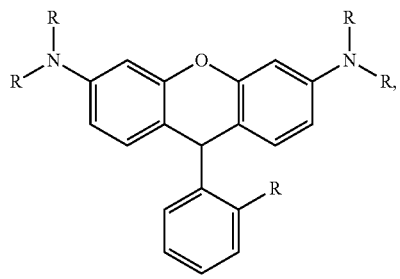

wherein R is methyl, ethyl, propyl, isopropyl, n-butyl or tert-butyl;

a structural formula of the cyanine is

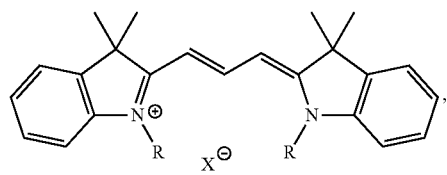

wherein R is methyl, ethyl, propyl, isopropyl, n-butyl or tert-butyl, X is halogen element;

a formula of the azo is

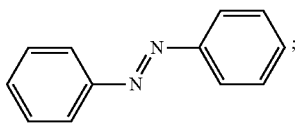

a formula of the anthraquinones is

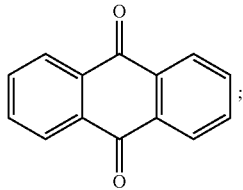 [SMILES: O=C1c2ccccc2C(=O)c2ccccc21]

a formula of the dioxazine is

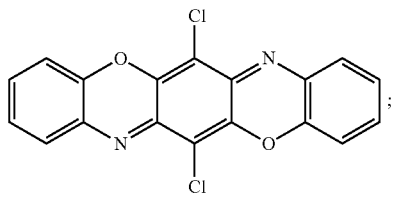 [SMILES: Clc1c2c(c(Cl)c3c1=Nc1ccccc1O3)=Nc1ccccc1O2]

a structural formula of triphenylmethane is

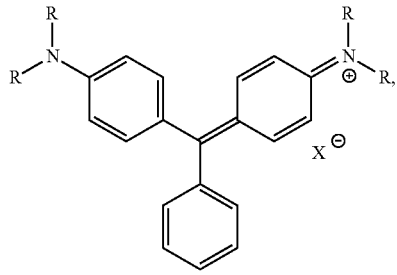

wherein R is methyl, ethyl, propyl, isopropyl, n-butyl or tert-butyl, X is halogen element.

The photoresist composition further includes monomers, a photo initiator and a solvent, and each mass percentage of components in the photoresist composition is that the color polymer accounts 2~15 wt % of total weight of the photoresist composition, the monomers accounts 3~10 wt % of total weight of the photoresist composition, the photo initiator accounts 0.1~0.6 wt % of total weight of photoresist composition, and the solvent accounts 70~90 wt % of total weight of the photoresist composition.

The present invention further provides a method of preparing a photoresist composition including:

step 1, synthesizing active dye molecules; and step 2, synthesizing a color polymer through a polymerization reaction of the active dye molecules and monomers of a polymer.

A formula of the dye molecules in step 1 is

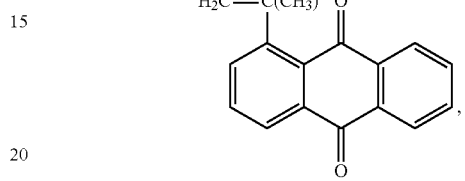

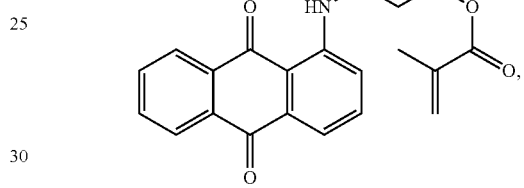

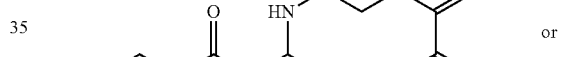 or

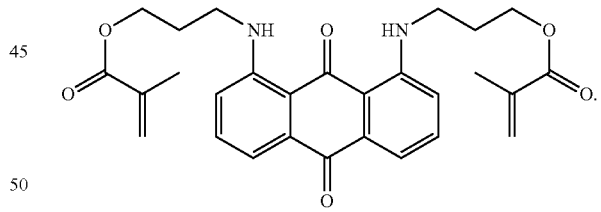

A formula of the color polymer obtained in step 2 is

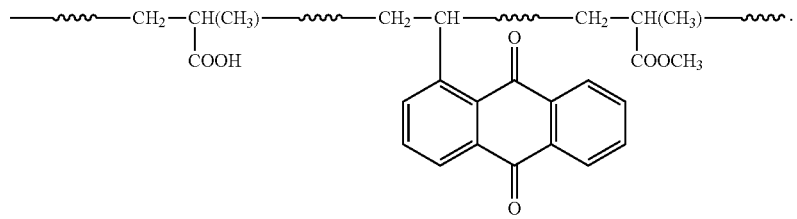

A chemical reaction equation of synthesizing the color polymer in step 2 is

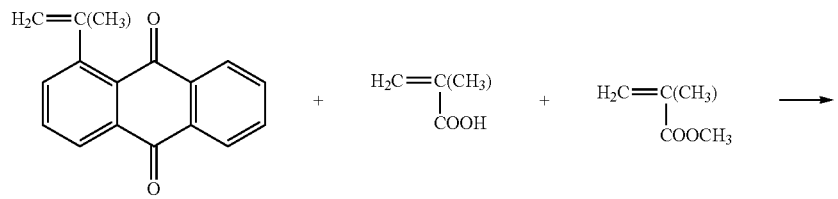

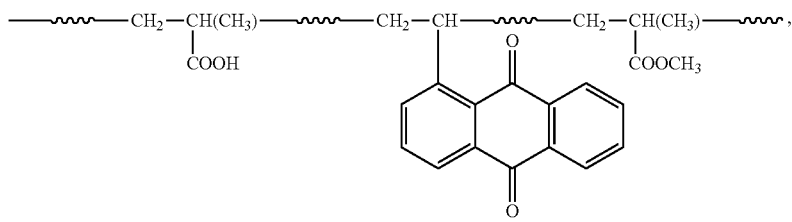

conditions of the chemical reaction are using azobisisobutyronitrile or benzoyl peroxide as a radical initiator of a working concentration in 2.0~10.0 mol %; using tetrahydrofuran, N,N-dimethyl-propionamide or acetone as a solvent; and performing the chemical reaction at a temperature in 40~100° C. and under inert gas protection.

The present invention further provides a photoresist composition including a color polymer that is obtained by dye molecules grafted to a polymer through chemical bonds; wherein a structural formula of the color polymer is

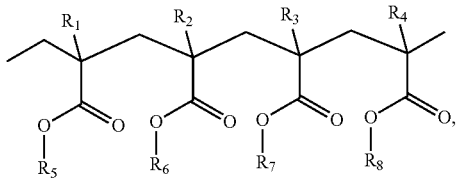

wherein at least one of $R_1$-$R_8$ is a dye group;
wherein the dye group is azo, anthraquinones, xanthene, cyanine, dioxazine or triphenylmethane;
wherein other substituent groups in $R_1$-$R_8$ besides the dye group are —CN, —H, —COOH, —$C_nH_{2n+1}$, —$OC_nH_{2n+1}$,

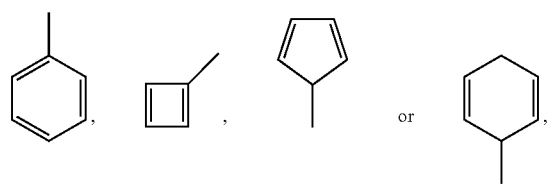

n is an integer in 1-10, the other substituent groups in $R_1$-$R_8$ besides the dye group are identical or different; and
wherein the photoresist composition further includes monomers, a photo initiator and a solvent, and each mass percentage of components in the photoresist composition is that the color polymer accounts 2~15 wt % of total weight of the photoresist composition, the monomers accounts 3~10 wt % of total weight of the photoresist composition, the photo initiator accounts 0.1~0.6 wt % of total weight of the photoresist composition, and the solvent accounts 70~90 wt % of total weight of the photoresist composition.

Advantageous effects of the present invention are that the present invention provides a photoresist composition and a method of preparing the same, the photoresist composition utilizes a color polymer to replace conventional pigments to preclude conventional problems of difficult to disperse pigments in the photoresist composition, poor contrast and brightness. Since the color polymer has brilliant color, high penetration, good thermal and light stabilities, so that the photoresist composition of the present invention has better color developing effect, preferred thermal and light stabilities. The present invention provides a method of preparing a photoresist composition which reduces components in the photoresist composition and simplifies preparation process of the photoresist composition, the photoresist composition obtained thereby has better color developing effect, also has preferred thermal and light stabilities.

In order to further understand the features and technical content of the present invention, please refer to following detailed description of the present invention.

DETAILED DESCRIPTION OF PREFERRED EMBODIMENTS

In order to further illustrate the technical means adopted by the present invention and the effects thereof, detailed description in connection with preferred embodiments of the present invention is described hereafter.

The present invention provides a photoresist composition to replace conventional color photoresist material for manufacturing color filter of liquid crystal displays, which includes a color polymer, monomers, a photo initiator and a solvent; the color polymer is a polymer containing dye molecules, which is formed by the dye molecules capable of color developing and grafted to the polymer molecule through chemical bonds.

The monomer may be acrylates of polyhydric alcohol, such as

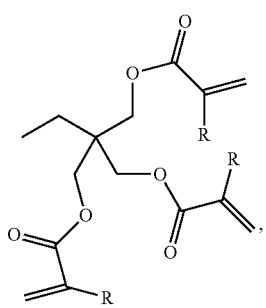

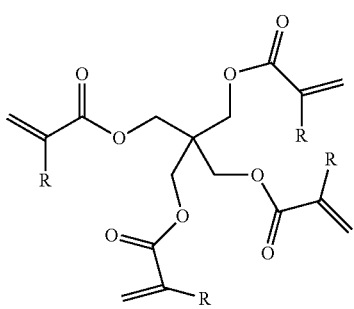

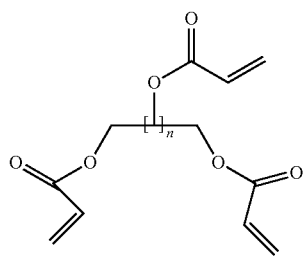

and the like, wherein group R is alkyl ($-C_nH_{2n+1}$).

The photo initiator may be acetophenones, bisidazoles, benzoin or benzophenones and the like, wherein the acetophenones are α, α-diethoxyacetophenone, 2-hydroxy-2-methylpropiophenone (2,2-dimethyl-α-hydroxyacetophenone, HMPP), or 2-methyl-2-morpholino-1-(4-methylphenylthio) propan-1-one and the like; the benzoin are benzyl, bis-hydroxyacetophenone, or benzoin ethers and the like.

The solvent is ester, ether or ketone, such as diethylene glycol dimethyl ether, diethylene glycol diethyl ether, ethylene glycol dimethyl ether, ethylene glycol ethyl ether acetate, diethylene glycol ethyl ether acetate, diethylene glycol monobutyl ether acetate, propylene glycol monomethyl ether acetate (PGMEA), ethyl 3-ethoxypropionate (EEP), 3-methoxybutyl acetate, cyclohexanone or isophorone and the like.

Each mass percentage of components of the photoresist composition is that the color polymer accounts 2~15 wt % of total weight of the photoresist composition, the monomers accounts 3~10 wt % of total weight of the photoresist composition, the photo initiator accounts 0.1~0.6 wt % of total weight of the photoresist composition, the solvent accounts 70~90 wt % of total weight of the photoresist composition.

A formula of the color polymer is

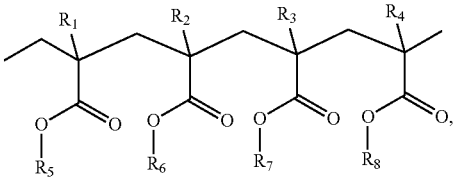

wherein $R_1$-$R_8$ are substituent groups, at least one of $R_1$-$R_8$ is a dye group.

The other substituent group in $R_1$-$R_8$ besides the dye group are —CN, —H, —COOH, —$C_nH_{2n+1}$, —$OC_nH_{2n+1}$,

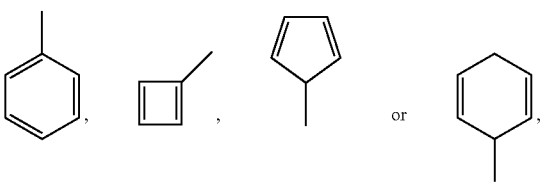

n is an integer in 1-10, the other substituent groups in $R_1$-$R_8$ besides the dye group are identical or different.

The dye group is azo, anthraquinone, xanthene, cyanine, dioxazine or triphenylmethane and the like.

A formula of the xanthene is

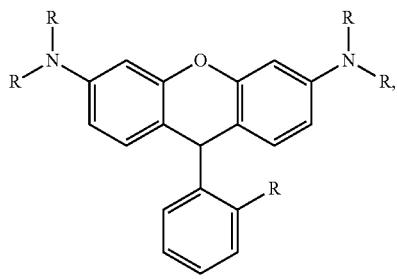

wherein R is methyl, ethyl, propyl, isopropyl, n-butyl or tert-butyl and the like;

a structural formula of the cyanine is

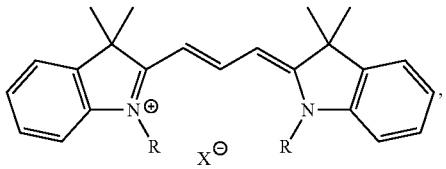

wherein R is methyl, ethyl, propyl, isopropyl, n-butyl or tert-butyl and the like, X is halogen element, such as Cl, Br, I;

a formula of the azo is

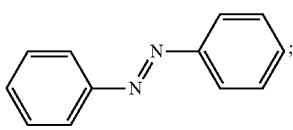 [SMILES: c1ccc(/N=N/c2ccccc2)cc1]

a formula of the anthraquinone is

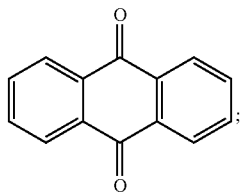 [SMILES: O=C1c2ccccc2C(=O)c2ccccc21]
;

a formula of the dioxazine is

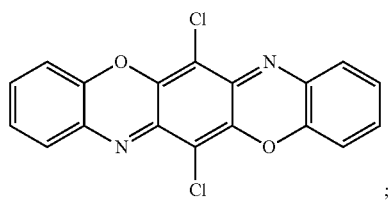 [SMILES: Clc1c2c(c(Cl)c3c1=Nc1ccccc1O3)=Nc1ccccc1O2]
;

a structural formula of the triphenylmethane is

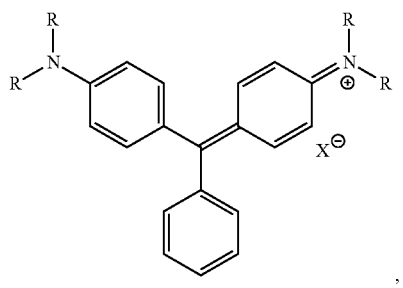
, wherein R is methyl, ethyl, propyl, isopropyl, n-butyl or tert-butyl and the like, X is halogen element, such as Cl, Br, I.

The present invention further provides a method of preparing a photoresist composition including following steps.

Step 1, synthesizing active dye molecules;

anthraquinone dyes, for example, a formula of the dye molecules may be

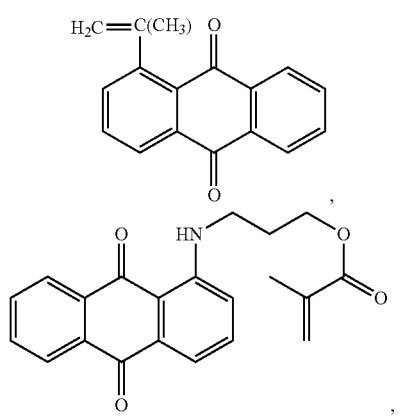
,

-continued

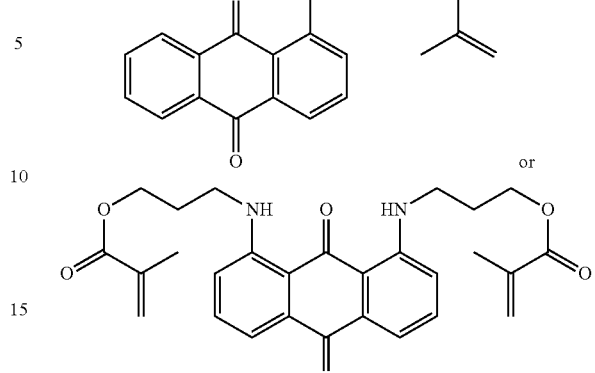
or

A synthesizing reaction equation of dye molecules

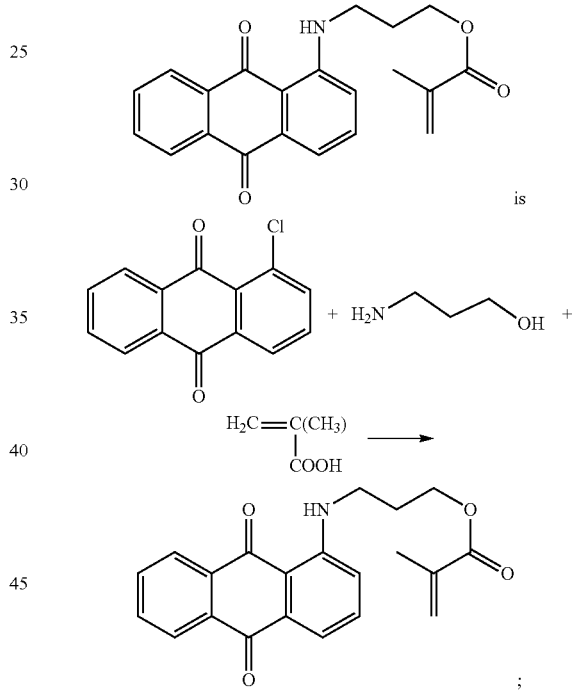
;

conditions of the reaction are tetrahydrofuran (THF) as a solvent, triethylamine as a catalyst, temperature in 60~80° C., performed with stirring under $N_2$ circumstance.

A synthesizing reaction equation of the active dye molecules

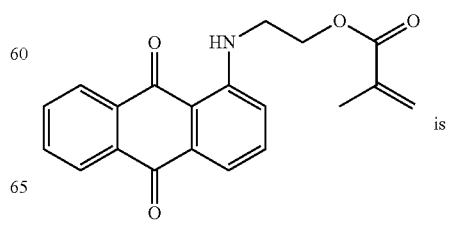
is

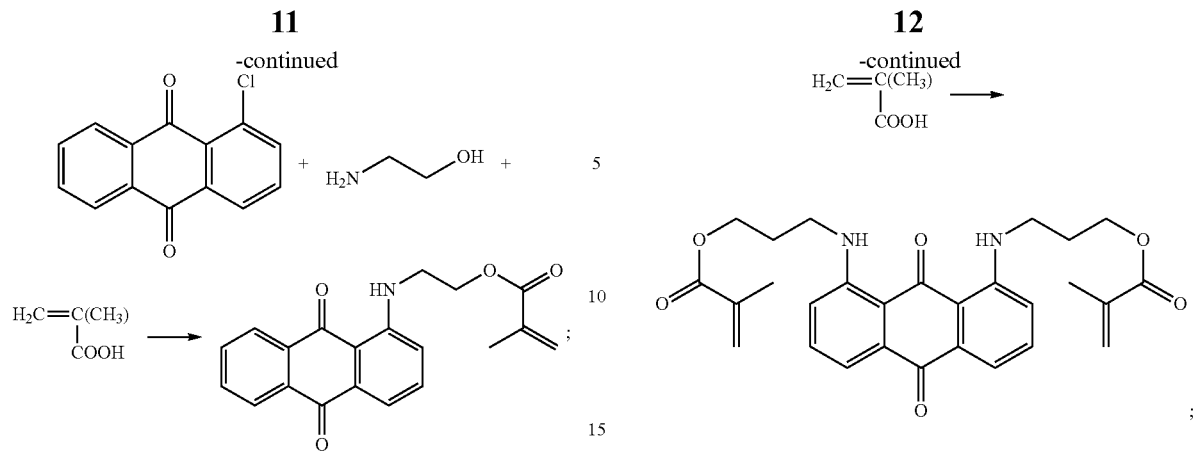

conditions of the reaction are tetrahydrofuran (THF) as a solvent, triethylamine as a catalyst, temperature in 60~80° C., performed with stirring under $N_2$ circumstance.

A synthesizing reaction equation of the active dye molecules

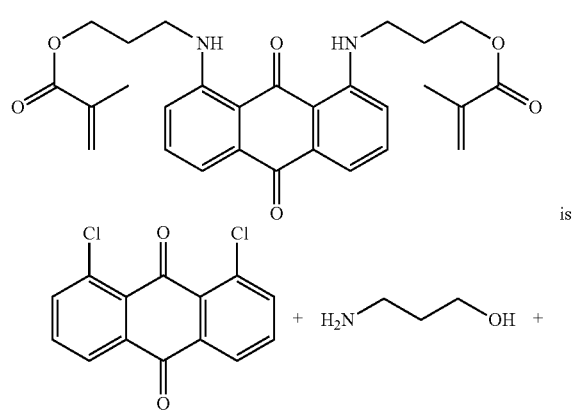

conditions of the reaction are tetrahydrofuran (THF) as a solvent, triethylamine as a catalyst, temperature in 60~80° C., performed with stirring under $N_2$ circumstance.

Step 2, the color polymer is synthesized through a polymerization reaction of the active dye molecules and monomers of a polymer.

The dye molecules

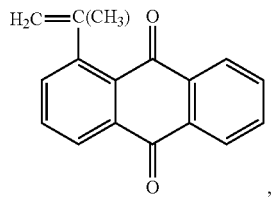

for example, a reaction equation of an embodiment of using them to synthesize the color polymer is

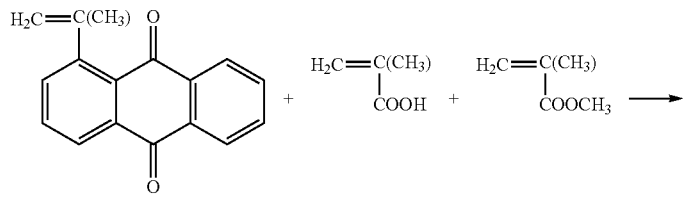

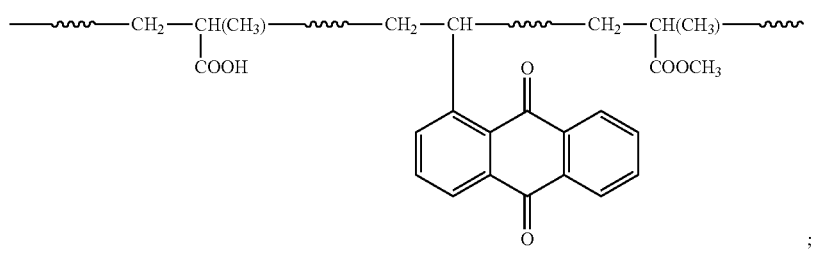

reaction conditions of the reaction are using a radical initiator of azobisisobutyronitrile (AIBN) or benzoyl peroxide (BPO) and the like to accelerate the synthesizing reaction, and the radical initiator of a working concentration in 2.0~10.0 mol %; and using tetrahydrofuran, N, N-dimethyl-propionamide or acetone and the like as a solvent; and performing the chemical reaction at a temperature in 40~100° C. and under inert gas (such as $N_2$) protection at a temperature.

The method of preparing the photoresist composition of the present invention further includes following step.

Step 3, the photoresist composition is prepared by mixing the obtained color polymer and the monomers, the photo initiator and the solvent.

Specifically, the color polymer of 2~15 wt %, the monomers of 3~10 wt %, the photo initiator of 0.1~0.6 wt % and the solvent of 70~90 wt % (each percentage of the components accounting total weight of the photoresist composition) are mixed to obtain the photoresist composition, since the active dye molecules are grafted to the polymer molecule to allow the photoresist composition be consisting of the four components of the color polymer, the monomers, the photo initiator and the solvent, the preparing process of the photoresist composition is simplified.

The present invention provides a photoresist composition and a method of preparing the same. The photoresist composition utilizes a color polymer to replace conventional pigments to preclude conventional problems of difficult to disperse pigments in the photoresist composition, poor contrast and brightness. Since the color polymer has brilliant color, high penetration, good thermal and light stabilities, so that the photoresist composition of the present invention has better color developing effect, preferred thermal and light stabilities. The present invention provides a method of preparing a photoresist composition which reduces components in the photoresist composition and simplifies preparation process of the photoresist composition, the photoresist composition obtained thereby has better color developing effect, also has preferred thermal and light stabilities.

According to the above description, a person of ordinary skill in the art can make various modifications and similar arrangements according to technical solutions and technical concepts of the present invention, and all the various modifications and similar arrangements are intended to be included within the spirit and scope of the appended claims.

What is claimed is:

1. A photoresist composition, comprising a color polymer that is obtained by dye molecules grafted to a polymer molecule through chemical bonds, wherein a formula of the dye molecules is

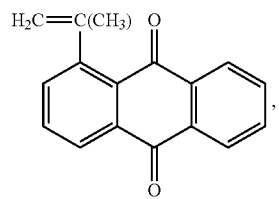

a formula of the color polymer is

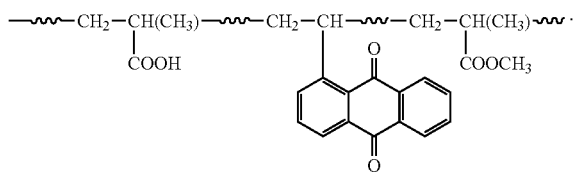

2. The photoresist composition according to claim 1, wherein the photoresist composition further comprises monomers, a photo initiator and a solvent, and each mass percentage of the components in the photoresist composition is that the color polymer accounts 2~15 wt % of total weight of the photoresist composition, the monomers account 3~10 wt % of total weight of the photoresist composition, the photo initiator accounts 0.1~0.6 wt % of total weight of the photoresist composition, and the solvent accounts 70~90 wt % of total weight of the photoresist composition.

3. A method of preparing the photoresist composition according to claim 1, comprising:

step 1, synthesizing active dye molecules, wherein a formula of the active dye molecules is

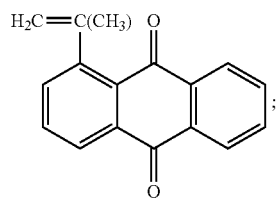

and step 2, synthesizing a color polymer through a polymerization reaction of the active dye molecules and monomers of a polymer, wherein a chemical reaction equation of synthesizing the color polymer in step 2 is

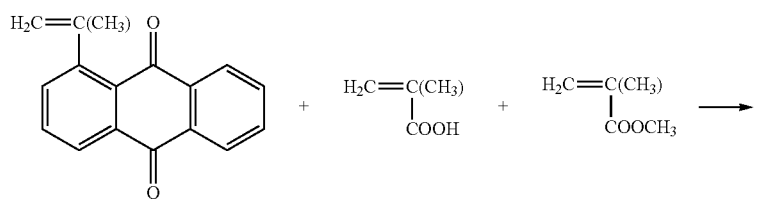

-continued
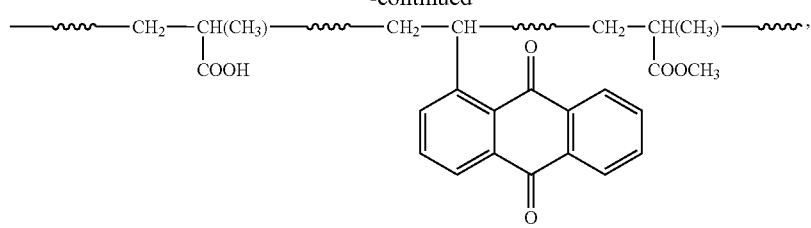
conditions of the chemical reaction are using azobisisobutyronitrile or benzoyl peroxide as a radical initiator of a working concentration in 2.0~10.0 mol %; using tetrahydrofuran, N,N-dimethyl-propionamide or acetone as a solvent; and performing the chemical reaction at a temperature in 40~100° C. and under inert gas protection.
* * * * *